(12) United States Patent
Huang et al.

(10) Patent No.: US 11,194,001 B2
(45) Date of Patent: Dec. 7, 2021

(54) METHOD OF PERFORMING MAGNETIC RESONANCE IMAGING AND A MAGNETIC RESONANCE APPARATUS

(71) Applicants: Siemens Healthcare Limited, Camberley (GB); King's College London, London (GB)

(72) Inventors: Li Huang, London (GB); Radhouene Neji, London (GB); Sebastien Roujol, London (GB)

(73) Assignees: Siemens Healthcare GmbH, Erlangen (DE); King's College, London, London (GB)

( * ) Notice: Subject to any disclaimer, the term of this patent is extended or adjusted under 35 U.S.C. 154(b) by 286 days.

(21) Appl. No.: 16/366,769

(22) Filed: Mar. 27, 2019

(65) Prior Publication Data

US 2019/0302208 A1 Oct. 3, 2019

(30) Foreign Application Priority Data

Mar. 27, 2018 (GB) ...................................... 1804898

(51) Int. Cl.
*G01R 33/50* (2006.01)
*G01R 33/483* (2006.01)
*G01R 33/44* (2006.01)
*G01R 33/56* (2006.01)

(52) U.S. Cl.
CPC ....... *G01R 33/4838* (2013.01); *G01R 33/443* (2013.01); *G01R 33/4835* (2013.01); *G01R 33/50* (2013.01); *G01R 33/5602* (2013.01)

(58) Field of Classification Search
CPC .............. G01R 33/561; G01R 33/4833; G01R 33/4836; G01R 33/5614; G01R 33/4838; G01R 33/443; G01R 33/4835; G01R 33/50; G01R 33/5602
USPC ........................................................ 324/309
See application file for complete search history.

(56) References Cited

U.S. PATENT DOCUMENTS

| 5,779,636 | A | 7/1998 | Kanazawa | |
|---|---|---|---|---|
| 2011/0181285 | A1* | 7/2011 | Greiser | G01R 33/50 324/309 |
| 2013/0272591 | A1* | 10/2013 | Xue | G06T 11/003 382/131 |

OTHER PUBLICATIONS

Blood T1 measurements using slice-interleaved T1 mapping (STONE) sequence.
Arrhythmia insensitive rapid cardiac T1 mapping pulse sequence.
(Continued)

*Primary Examiner* — Melissa J Koval
*Assistant Examiner* — Courtney G McDonnough
(74) *Attorney, Agent, or Firm* — Schiff Hardin LLP (57) ABSTRACT

In a method and apparatus for performing magnetic resonance (MR) imaging for generating multiple T1 maps of separate regions of interest of a subject along a first spatial axis, multiple MR pulse sequences are generated, each MR pulse sequence being for imaging a respective one of the separate regions of interest of the subject. In order to generate each of the plurality of MR pulse sequences, a spatially selective preparation pulse is generated exciting the region of interest of the subject and a number of imaging sequences that follow the application of the spatially selective preparation pulse are generated. MR imaging data are acquired during the generation of the multiple imaging sequences. The multiple MR pulse sequences are generated during a period not exceeding 30 seconds.

19 Claims, 4 Drawing Sheets

(56) References Cited

OTHER PUBLICATIONS

Piechnik et al., Shortened Modified Look-Locker Inversion Recovery (ShMOLLI) for Clinical Myocardial T1-Maping at 1.5 and 3 T within a 9 Heartbeat Breathhold, Journal of Cardiovascular Magnetic Resonance, 12(1), pp. 1-11, 2010; 2010.

* cited by examiner

METHOD OF PERFORMING MAGNETIC RESONANCE IMAGING AND A MAGNETIC RESONANCE APPARATUS

BACKGROUND OF THE INVENTION

Field of the Invention

The present invention relates to a method of performing magnetic resonance (MR) imaging and a magnetic resonance apparatus. In particular, the present invention relates to a method of performing magnetic resonance imaging and a magnetic resonance apparatus for generating a plurality of T1 maps.

Description of the Prior Art

T1 relaxation time, also known as the spin-lattice or longitudinal relaxation time, is a measure of how fast the nuclear spin magnetization returns to its equilibrium state after an excitation pulse. T1 is a key source of soft tissue contrast in MRI.

Generating a T1 map of an examination area is a useful tool for a medical professional to identify diseases, lesions and abnormalities in soft tissue that affect T1. T1 mapping is useful to characterize diffuse or infiltrative myocardial diseases, including cardiomyopathies, myocarditis, and amyloidosis.

T1 mapping, and in particular cardiac T1 mapping or myocardial T1 mapping, may be performed using specific MR pulse sequences.

One such MR pulse sequence is commonly known as the MOdified Look-Locker Inversion recovery (MOLLI) which may be used for myocardial T1 mapping. In an example MOLLI sequence, an inversion pulse is generated and followed by the acquisition of five images. The five images are acquired during the diastolic period of the cardiac cycle within five successive heartbeats. The diastolic period is the phase of the heartbeat when the myocardium relaxes to allow the chambers of the heart to fill with blood. After the acquisition of the five images, there is a rest period of three heartbeats, before the sequence is repeated for three heartbeats. The inversion pulse and the image acquisitions are electrocardiogram, ECG, triggered meaning that a cardiac event as measured by an ECG apparatus triggers the generation of the inversion pulse and the image acquisitions.

Here, an "inversion pulse" means a 180 degrees excitation pulse that acts to flip the initial longitudinal magnetization of a subject's tissue to point opposite to the direction of the main (.e. static) magnetic field. The inversion is applied to the whole of the subject. Image acquisition is applied to a selected region or slice of the subject as a whole.

The resultant images may then be sorted in ascending order with respect to the time after the generation of the inversion pulse, the inversion time (TI), and the signal intensity in each pixel of the image may be fit onto an apparent T1 recovery curve during a T1 fitting process. The apparent T1 recovery curve may follow a three-parameter model $S(t)=A-B \exp(-t/T1^*)$ where $S(t)$ is the signal intensity at time t after application of the inversion pulse. A, B and $T1^*$ are the parameters to be estimated by the curve fitting. $T1^*$ is the apparent recovery time rather than the actual recovery time T1. T1 can be calculated by applying the correction $T1=T1^* \times ((B/A)-1)$. In some examples, the correction $T1=T1^* \times ((B/A)-1)/C$ may be applied where C is an inversion factor of the inversion pulse. After computing the T1 for each pixel, a T1 map for the region of interest may be generated.

Another such specialized pulse sequence is commonly known as the SAturation-recovery-Single-SHot Acquisition (SASHA) which may also be used for myocardial T1 mapping. SASHA is also ECG triggered, and within each cardiac cycle during the SASHA sequence, a saturation pulse is generated followed by an image acquisition. In SASHA, each of the images is acquired at the same point in the cardiac cycle, but with different times after the application of the saturation pulse.

Here, a saturation pulse refers to a 90 degrees excitation pulse that acts to tip the initial longitudinal magnetization of a subject's tissue into the transverse magnetization plane. The saturation pulse is applied to the whole of the subject, and image acquisition is applied to a selected region or slice of the subject as a whole. The saturation pulse is followed by magnetic spoiling gradients in order to destroy the transverse magnetization.

The resultant images may then be sorted in order of increasing time after the application of the saturation pulse and the signal intensity in each pixel of the image may be fit onto a T1 recovery curve during a T1 fitting process. The T1 recovery curve may follow a three-parameter model $S(t)=A-B \exp(-t/T1)$ where $S(t)$ is the signal intensity at time t after application of the saturation pulse. A, B and T1 are the parameters to be estimated by the curve fitting. After computing the T1 for each pixel, a T1 map for the region of interest may be generated. A two-parameter model $S(t)=A(1-2 \exp(-t/T1))$ may also be used.

Another such specialized pulse sequence is commonly known as the Saturation-Pulse Prepared Heart-rate independent Inversion-REcovery (SAPPHIRE) which may also be used for myocardial T1 mapping. SAPPHIRE is also ECG triggered, and within each cardiac cycle during the SAPPHIRE sequence, a saturation pulse is generated followed by an inversion pulse and an image acquisition. In SAPPHIRE, each of the images is acquired at the same point in the cardiac cycle, but with different times after the application of the saturation pulse and inversion pulse.

The resultant images may then be sorted in order of increasing time after the application of the saturation pulse and the signal intensity in each pixel of the image may be fit onto a T1 recovery curve during a T1 fitting process. The T1 recovery curve may follow a three-parameter model $S(t)=A(1-B(2-\exp(-Tsatinv/T1)) \exp(-t/T1)$ where $S(t)$ is the signal intensity at time t after application of the saturation pulse. Tsatinv is the time between the saturation and the inversion pulse. A, B and T1 are the parameters to be estimated by the curve fitting. After computing the T1 for each pixel, a T1 map for the region of interest may be generated. A two-parameter model $S(t)=A(1-(2-\exp(-Tsatinv/T1)) \exp(-t/T1)$ may also be used.

The MOLLI, SASHA, and SAPPHIRE sequences are desired to be performed during a single breath-hold to reduce respiratory motion artifacts, but this can be challenging depending on the condition of the subject being imaged. In addition, a single MOLLI, SASHA or SAPPHIRE sequence is only designed to generate a T1 map for a single region of interest in the subject, e.g. a single slice. To generate a T1 map for a new region of interest, e.g. a different slice, it is necessary to repeat the MOLLI or SASHA or SAPPHIRE sequence with different imaging magnetic field gradients (i.e. so that a different region is imaged). Especially for MOLLI type sequences which use inversion pulses, this can only be done after sufficient time has elapsed to allow for the magnetization effects as a result of the previous inversion pulse to recover such that the magnetization returns to equilibrium before a new inversion can be applied afresh.

The total time required to perform the sequence, wait for the magnetization effects to return to equilibrium, and repeat the sequence is sufficiently long that it is impractical for multiple T1 maps of different regions of the subject to be generated during a single breath-hold. As a result, the acquisition of multiple T1 maps for different regions of the subject using these existing approaches, and especially the MOLLI approach, may take a long time to be performed, and require subject cooperation to minimize the effects of motion between breath-holds.

There have been attempts to reduce the amount of time required to obtain a T1 map or multiple T1 maps for different regions of a subject.

In one existing approach known as Shortened MOLLI (ShMOLLI), the MOLLI sequence is modified to enable T1 mapping to be performed in 9 heartbeats. In another approach known as arrhythmia-insensitive rapid cardiac T1 mapping (AIR), the T1 map is able to be generated using 2 heartbeats. However, these existing approaches are only capable of generating a T1 map for a single region of interest in the subject, e.g. a single slice. To generate multiple T1 maps for multiple different regions of interest, it is still necessary to wait for sufficient time to elapse so that the magnetization approaches equilibrium before repeating the ShMOLLI or AIR sequence with different imaging gradients. The amount of time required for the magnetization to recover to equilibrium means that these existing approaches are still impractical for multiple T1 maps of different regions of the subject to be generated during a single breath-hold.

There are other existing approaches known as free breathing myocardial T1 mapping which, rather than requiring that the subject hold their breath, correct for respiratory motion. This is performed by combining diaphragmatic-navigator based slice tracking and in-plane registration. However, the robustness of these techniques is still generally inferior to breath-hold acquisitions and still require a large number of images for T1 map reconstructions (>5 images per slice) which results in long imaging protocols.

SUMMARY OF THE INVENTION

It is an object of the present invention to improve on these existing approaches of MR imaging, such as by providing an improved way to generate T1 maps, or at least to provide an alternative approach to generate T1 maps.

According to a first aspect of the invention, a method is provided for performing magnetic resonance (MR) imaging for generating a plurality of T1 maps of separate regions of interest of a subject along a first spatial axis, the method comprising:

generating a plurality of MR pulse sequences, each MR pulse sequence being for imaging a respective one of the regions of interest of the subject, wherein generating each MR pulse sequence of the plurality of MR pulse sequences comprises:

(a) generating a spatially selective preparation pulse for exciting the region of interest of the subject, the generating comprising generating an excitation pulse at the same time as generating a magnetic field gradient along a first spatial axis;

(b) generating a plurality of imaging sequences following the application of the spatially selective preparation pulse, the plurality of imaging sequences being for imaging the region of interest of the subject;

(c) acquiring MR imaging data during the generation of the plurality of imaging sequences; and generating, for each region of interest, the T1 map for the region of interest from the MR imaging data acquired during the associated MR pulse sequence, wherein the plurality of MR pulse sequences are generated during a period not exceeding 30 seconds.

Excitation pulses are also known as radio-frequency (RF) pulses.

Significantly, the method of the first aspect of invention generates a spatially selective preparation pulse. Desirably, the spatially selective preparation pulse comprises an excitation pulse and a magnetic field gradient along a first spatial axis. The existing approaches identified above do not use a spatially selective preparation pulse. Instead, they use a non-selective preparation pulse that may excite all of the subject's tissue rather than a select region. Generating a spatially selective preparation pulse means that only a limited region of the subject is excited by the preparation pulse. When imaging a selected region, and exciting that region for imaging, neighboring regions (i.e. regions of adjacent slices that are also desired to be imaged to generate a T1 map) are not contemporaneously excited or are only excited to a limited extent (e.g. incidentally). This means that present method does not need to wait for magnetization equilibrium before imaging the next region of interest because the next region of interest to be imaged remains substantially undisturbed and is already at magnetization equilibrium. This means that the next T1 map can be generated in the same breath hold of the subject. Significantly, the present invention can reduce scan costs as the total time needed to perform the MR imaging may be reduced even with more regions of interest (e.g. slices) covering the whole heart. Further, the present invention enables T1 mapping to be used more readily in clinical settings, and thus has improved the clinical feasibility for T1 mapping.

Because of the use of a spatially selective preparation pulse for each MR pulse sequence, the present invention does not require a long time period between MR pulses sequences for separate regions of interest. This means that the plurality of MR pulse sequences are able to be generated during a period not exceeding 30 seconds. That is, they may be generated during a single breath-hold of a user.

Here, a MR pulse sequence may mean a pulse sequence sufficient to acquire MR imaging data. The plurality of MR pulses sequences are thus a plurality of pulse sequences sufficient to acquire MR imaging data for the plurality of different regions of interest. The plurality of pulse sequences may be considered together as forming one MR pulse sequence comprising a plurality of MR pulse sub-sequences.

It will be appreciated that additional MR pulse sequences may be included in the method of the first aspect of the invention. The additional MR pulse sequences may be generated after the period not exceeding 30 seconds. The additional MR pulses sequences may be, for example, generated during a different breath-hold of the subject.

The plurality of MR pulse sequences may be generated during a period not exceeding 20 seconds. A normal duration breath hold may be considered as having, normally, a duration of around 17 heartbeats which is typically less than 20 seconds. This means that the plurality of MR pulse sequences are able to be generated during a single, normal, breath-hold of a user.

The plurality of MR pulse sequences may be generated during a period not exceeding 15 seconds.

The plurality of MR pulse sequences may be generated during a period between 10 and 14 seconds. This may be a period of time during which a number of different subjects across a range of different backgrounds, ages, and health conditions may be expected to comfortably hold their breath.

It will be appreciated that the step of generating the T1 map from the acquired MR imaging data does not need to be performed during the above time periods, and instead can be performed at any time after acquisition of the MR imaging data.

Here, separated regions of interest may include regions of interest that partially overlap one another or which are completely separate from one another such that there are no parts of the regions of interest that overlap with one another. That is, the separate regions of interest may be different regions of interest separated along the first spatial axis.

The plurality of MR pulse sequences comprise between 2 and 12 MR pulse sequences. This means that T1 maps for between 2 and 12 separate regions of interest of the subject may be obtained during a period not exceeding 30 seconds, or not exceeding 20 seconds, or between 2 and 14 seconds, between 4 and 10 seconds, or between 10 and 14 seconds. This means that T1 maps for between 2 and 12 separate regions of interest of the subject may be obtained during a single breath-hold of the subject. In one example, T1 maps for 2 separate regions of interest may be obtained, with 2 images being acquired per region of interest. In other words, the method may be performed during 4 heartbeats of the subject.

For at least one of the plurality of MR pulse sequences, the magnetic field gradient along the first spatial axis may be a slice-selective magnetic field gradient. The first spatial axis may be the orthogonal direction of the slice. The first spatial axis may be prescribed by the user when the user determines the position for the desired slice. That is, the dimension along which the separate regions of interest are obtained may be selected as desired by the user.

For at least one of the plurality of MR pulse sequences, the excitation pulse may be an inversion pulse or a saturation pulse, or a combination of an inversion pulse and a saturation pulse. The combination of the inversion pulse and the saturation pulse may mean that a saturation pulse is generated first which is then, after a delay, followed by an inversion pulse so that the next pulse after the saturation pulse is the inversion pulse. Other forms of excitation pulse are within the scope of the present invention.

The inversion pulse may be a 180 degrees excitation pulse that acts to flip the initial longitudinal magnetization of tissue in the region of interest to point opposite to the direction of the main magnetic field. The inversion pulse is not required to be exactly 180 degrees, and may be less than or more than 180 degrees. For example, an inversion pulse may be between 170 and 180 degrees. A smaller or larger inversion pulse angle may be used at the cost of precision in the T1 maps. In other words, the angle of the inversion pulse may be modified as desired. Different fitting models may be used based on the angle chosen.

The saturation pulse may be a 90 degrees excitation pulse that acts to tip the initial longitudinal magnetization of a subject's tissue into the transverse magnetization plane. The saturation pulse is not required to be exactly 90 degrees, and may be less than or more than 90 degrees. For example, a saturation pulse may be between 80 and 90 degrees. A smaller or larger saturation pulse angle may be used at the cost of precision in the T1 maps. In other words, the angle of the saturation pulse may be modified as desired. Different fitting models may be used based on the angle chosen.

While benefits may be achieved using saturation pulses, particular benefits are obtained when inversion pulses are used. In particular, when considering existing techniques, inversion based T1 mapping techniques such as MOLLI and ShMOLLI are preferred over saturation based techniques such as SASHA due to their higher signal to noise ratio. However, the generated inversion pulse in these existing approaches excites all or a significant part of the subject's tissue (e.g. all of the tissue within the MR apparatus performing the MR imaging). This means that once image data for one slice is obtained, the method must enter a recovery period to allow for magnetization equilibrium to be reached. This means that it is not practical for images of different slices to be obtained during a single breath-hold using these existing inversion based techniques.

With the method of the first aspect of the invention, desirably a magnetic field gradient along a first spatial axis (e.g. a slice select axis) is generated at the same time as the inversion pulse. This means that the inversion pulse only excites a limited region of the subject. Neighboring regions (i.e. regions of adjacent slices that are desired to be imaged to generate a T1 map) are not excited or are only excited to a limited extent (e.g. incidentally). This means that the present method does not need to wait for magnetization equilibrium before imaging the next slice because the next slice to be imaged is already at magnetization equilibrium. This means that the next T1 map can be generated in the same breath hold of the subject. As such, the method of the first aspect of the invention improves on the existing inversion based techniques for T1 mapping, while at the same time enabling the benefits of the existing inversion based techniques (e.g. high SNR) to be provided.

For at least one of the plurality of MR pulse sequences, the spatially selective preparation pulse may be generated to excite the region of interest of the subject and adjacent regions of the subject. The spatially selective preparation pulse may be arranged to excite, in total, a region of a subject's tissue that has a thickness ($T_{Total}$) which is N times the thickness of that tissue imaged by an excitation pulse of the plurality of imaging sequences ($T_{ROI}$). N is referred to as "inversion-to-excitation slice thickness" ratio and is defined as $N=T_{Total}/T_{ROI}$. That is, the total thickness of the region excited by the spatially selective preparation pulse ($T_{Total}$) may have a thickness N times the thickness of the region of the interest ($T_{ROI}$) imaged by the plurality of imaging sequences. N may be a real number greater than 1. N may be between 1 and 50, N may be between 2 and 50, N may be between 1 and 40, N may be between 2 and 40, N may be between 1 and 30, N may be between 2 and 30, N may be between 1 and 20, N may be between 2 and 20, N may be between 1 and 10, N may be between 2 and 10, N may be between 1 and 5 and may be between 2 and 5. N may be between 10 and 50, N may be between 20 and 50, N may be between 30 and 50, N may be between 40 and 50. It will be appreciated that the present invention is not limited to this particular range of values for N. In one preferred example, N is 4.

The region of interest may be centered within the region excited by the spatially selective preparation pulse or may be offset from the center, if desired.

It will be appreciated that the thickness of the region excited by the spatially selective preparation pulse ($T_{Total}$) depends on the bandwidth of the excitation pulse and the magnitude of the magnetic field gradient applied along the first spatial axis. Generally, the thickness of the region ($T_{Total}$) excited by the pulse is equal to the bandwidth of the excitation pulse divided by the magnitude of the magnetic field gradient times a constant known as the gyro-magnetic ratio. A longer duration of excitation pulse in time means a smaller bandwidth, and thus a thinner region is excited (if the magnetic field gradient is kept constant). A shorter duration of excitation pulse in time means a larger bandwidth, and thus a thicker region is excited (if the magnetic field gradient is kept constant). A larger magnetic field gradient in magnitude also results in a thinner region being excited (if the bandwidth of the pulse is kept constant, while a smaller magnetic field gradient in magnitude results in a thicker region of interest being excited (if the bandwidth of the pulse is kept constant).

By way of example, the region of interest may be desired to have a thickness ($T_{ROI}$) of 5 mm. If the magnetic field gradient is 5 mT/m, then the bandwidth of the excitation pulse needs to be approximately 1 kHz to achieve this desired thickness. This means that the excitation pulse (for imaging) is of a duration of approximately 1 ms. This calculation assumes that the bandwidth-time product of the pulse is equal to 1, which is not necessarily the case in all situations. That is, this calculation is provided just for illustrative purposes.

If the inversion-to-excitation slice thickness ratio N is desired to be 4 then the spatially selective preparation pulse needs to excite a region having a thickness ($T_{Total}$) of 20 mm. This may be achieved by using a magnetic field gradient of 5 mT/m and a bandwidth of approximately 4 kHz. As a result, the excitation pulse for the spatially selective preparation pulse may have a duration of approximately 0.25 ms. This calculation assumes that the bandwidth-time product of the pulse is equal to 1, which is not necessarily the case in all situations. That is, this calculation is provided just for illustrative purposes.

Alternatively, the magnitude of the magnetic field gradient may be modified (e.g. increased or decreased as appropriate), and the bandwidth kept constant. Alternatively still, both the magnitude of the magnetic field gradient and the bandwidth may be changed.

In example implementations, the spatially selective preparation pulse may excite a region ($T_{Total}$) having a thickness between 6 mm and 50 mm, 6 mm and 40 mm, 6 mm and 30 mm, 6 mm and 20 mm, 6 mm and 10 mm, 10 mm and 50 mm, 20 mm and 50 mm, 30 mm and 50, or 40 mm and 50 mm It will be appreciated that the present invention is not limited to these particular ranges of values.

In example implementations, $T_{ROI}$ may have a thickness of between 1 mm and 50 mm, 1 mm and 40 mm, 1 mm and 30 mm, 1 mm and 20 mm, or 1 mm and 10 mm, or 1 mm and 5 mm. The thickness $T_{ROI}$ may be greater than or equal to 2 mm, or may be between 2 mm and 10 mm, or may be between 2 mm and 5 mm. $T_{ROI}$ may be no greater than 10 mm, may be between 3 mm and 10 mm, or 5 mm and 10 mm. In one example $T_{ROI}$ may be between 3 mm and 12 mm. It will be appreciated that the present invention is not limited to these particular ranges of values.

It will be appreciated that the skilled person may select the number of imaging sequences for each MR pulse sequence based on factors such as the desired quality of the T1 map, the health of the subject and the expected breath hold duration for the patient, and the desired number of T1 maps to be generated (e.g. for separate regions) during a breath hold. It will further be appreciated that the desired magnetic field gradient magnitude and excitation pulse bandwidth may be selected based on similar factors and based on the capabilities of the MR apparatus.

Desirably, the spatially selective preparation pulse may be generated to excite a collective region comprising, continuously, the region of interest and the adjacent regions of the subject simultaneously such that the region of interest resides inside the collective region between two adjacent regions at opposite sides of the region of interest.

Exciting an area $T_{Total}$ having a thickness N times thicker than the region of interest $T_{ROI}$ to be imaged is beneficial in accounting for motion of the subject during the imaging sequences. In particular, due to motion, e.g. cardiac or respiratory motion, a region of the subject that was outside of the region of interest when the preparation pulse was applied may move into the region of interest when one of the imaging sequences is generated. If the preparation pulse only excited the tissue originally within the region of interest, then useful image data for the part of the subject that has moved into the region of interest would not be obtainable. Therefore, by exciting a region slightly larger than the region of interest this problem is mitigated. It will be appreciated that still only a small region of the subject is excited by the preparation pulse, and this still contrasts with existing approaches where all of the tissue of the subject was excited by the preparation pulse, i.e. because the preparation pulse was not selective. This may help correct for all types of motion that can be encountered. This includes cardiac motion between the time the preparation pulse is applied and the imaging sequences are applied, and cardiac motion variability due to variation of heart rate, and respiratory motion (due to incorrect breath-holds).

The total thickness of the region excited by the spatially selective preparation pulse ($T_{Total}$) may have a thickness exceeding the thickness of the region of interest ($T_{ROI}$) which an excitation pulse of an image sequence(s) is generated to excite.

The gap between regions of interest (e.g. slices) may be thicker than the thickness $T_{Total}$ of the region excited by the spatially selective preparation pulse, but is not always required to be so.

The gap between regions of interest may be determined based on the relationship: region of interest thickness+2×gap thickness >$T_{Total}$. In this example, the gap between regions of interest may thus be less than $T_{Total}$, but may be more than $T_{Total}$ if desired. This relationship may be used, in particular, when the MR pulse sequences are generated in a non-interleaved fashion.

In another example, the gap between regions of interest may be determined based on the relationship: 3×region of interest thickness+4×gap thickness >$T_{Total}$. This relationship may be used, in particular, when the MR pulse sequences are generated in an interleaved fashion.

By determining the gap between regions of interest according to the above relationships, this helps enable there to be no or only limited (e.g. incidental) excitation of to-be imaged regions of interest that are adjacent to the region of interest excited by the spatially selective preparation pulse.

In one example, the gap between regions of interest (e.g. slices) may be between 0.5 and 1.5 times the thickness $T_{Total}$. In one example, the gap between regions of interest (e.g. slices) may be between 0 to 5 times the thickness of the regions of interest $T_{ROI}$, and is preferably 2 times the thickness of the region of interest $T_{ROI}$.

In example approaches, gaps between regions of interest are not required or may be minimized. This may be because the MR imaging data for regions of interest are acquired in an interleaved fashion. For example, there may be five desired regions of interest numbered 1 through 5. The MR imaging data may be acquired for the regions of interest in the order 1, 3, 5, 2 and 4. Additionally a rest period of perhaps a second or two seconds may be provided between the acquiring of region of interest 5 and region of interest 2 as this may allow for a smaller gap between slices or a larger value of N. In any event, the gap between slices should be set by the skilled person as desired, e.g. so as to minimize the interactions between slices.

For at least one of the plurality of MR pulse sequences, each imaging sequence may be generated during a different cardiac cycle of the subject. A first of the plurality of imaging sequences may be generated during the same cardiac cycle as the generation of the spatially selective preparation pulse.

For at least one of the plurality of MR pulse sequences, the spatially selective preparation pulse and/or the plurality of imaging sequences may each be triggered by a cardiac event as measured by a cardiac monitoring apparatus such as an electrocardiogram, ECG, apparatus. In other words, the spatially selective preparation pulse and/or the plurality of imaging sequences are triggered by a cardiac event, e.g. are ECG triggered. The present invention is not limited to cardiac monitoring using ECG apparatuses and other forms of cardiac monitoring are within the scope of the invention. For example, implantable cardiac monitors may be used. Further, cardiac events may be monitored by the MRI apparatus itself, e.g. through the use of image navigator pulses.

At least one of the T1 maps may be a cardiac T1 map. In other examples, the T1 map may be a liver T1 map or a fetal T1 map or a T1 map for another region of interest of the body. Generally, the present invention is particularly advantageous in T1 mapping for the cardiac region because of the requirement to perform T1 mapping of the cardiac region with minimal motion artifacts due to respiratory motion. This may require performing T1 mapping during a single breath-hold. The present invention is advantageous as explained above at least in that it enables T1 maps for multiple regions of interest to be obtained in a single breath-hold.

For at least one of the plurality of MR pulse sequences, the plurality of imaging sequences may comprise balanced gradient pulse trains. A "balanced gradient pulse trains" means that the net gradient applied during an imaging sequence is balanced, i.e. that there is no net gradient change. Since theoretically perfect operation of any MR apparatus is unlikely, it should be understood that the term "balanced" as used herein is meant to encompass substantially-preserved longitudinal and transverse magnetization, in which the net gradient-induced dephasing over a repetition time is substantially zero.

For at least one of the plurality of MR pulse sequences, the plurality of imaging sequences may be balanced steady-state free precession, bSSFP, type sequences. bSSFP sequences, also known as "True FISP", "FIESTA" and "T2-FFE" for instance, are widely known in magnetic resonance imaging. A bSSFP sequence is a coherent balanced sequence, in which balanced gradients are used, namely for all three axes. This means that the gradient-induced dephasing is cancelled during a complete repetition of the sequence. The bSSFP sequence benefits from a high read-out efficiency due to the short echo times (TE) and repetition times (TR), which are on the order of milliseconds. A further advantage of bSSFP is the high signal-to-noise ratio that is achieved therewith.

The plurality of imaging sequences are not limited to bSSFP type sequences and any image readout sequences may be used as appropriately selected by the skilled person. For example, gradient echo imaging may be used.

For at least one of the plurality of MR pulse sequences, generating the plurality of imaging sequences may comprise generating between 2 and 12 imaging sequences, preferably between 2 and 10 or between 2 and 5 imaging sequences. By "imaging sequence" we mean the part of the MR pulse sequence used for imaging. This means that between 2 and 12 images per region of interest (e.g. slice), and preferably between 2 and 10 or 2 and 5 images per region of interest (e.g. slice).

Generating at least one of the T1 maps from the acquired MR imaging data may comprise using a 2-parameter or a 3-parameter model. The 3-parameter model may be defined as $S(t)=A-B \exp(-t/T1)$ where $S(t)$ is the signal intensity at time t after application of the excitation pulse. A, B and T1 are the parameters to be estimated by the curve fitting. After computing the T1 for each pixel, a T1 map for the region of interest may be generated. A two-parameter model $S(t)=A(1-2 \exp(-t/T1))$ may also be used.

For at least one of the plurality of MR pulse sequences, if the excitation pulse is a saturation pulse, the method may comprise generating a plurality of spatially selective preparation pulses for exciting the region of interest of the subject. Each of the plurality of spatially selective preparation pulses may precede one of the imaging sequences. In other words, the generation of each spatially selective preparation pulse is followed by the generation of an imaging sequence. Each of the imaging sequences may be triggered by an electrocardiogram, ECG, apparatus. Each of the imaging sequences may be generated such that images are acquired at the same point in the cardiac cycle. Each of the spatially selective preparation pulses may be triggered, by an ECG apparatus. Each of the spatially selective preparation pulses may be generated during a different point in the cardiac cycle such that the MR imaging data for each of the imaging sequences is obtained at the same point in the cardiac cycle, but with different times after the generation of the spatially selective preparation pulse.

The T1 maps may all be cardiac T1 maps, and each region of interest may be a region of interest in the heart. The plurality of T1 maps may cover a whole heart region or a significant region of the heart of the subject. That is, the present invention may provide a whole heart myocardial T1 mapping.

The plurality of MR pulses may not comprise any spatially non-selective preparation pulses. That is, all of the preparation pulses (e.g. inversion or saturation pulses) may be spatially selective.

After generating one of the MR pulse sequences, there may be a time period sufficient for one or more heartbeats of the subject to have occurred before generating the subsequent MR pulse sequence. The subsequent MR pulse sequence may be triggered by a cardiac event monitored by a cardiac monitoring apparatus such as an ECG apparatus.

According to a second aspect of the invention, there is provided a magnetic resonance (MR) apparatus for generating a plurality of T1 maps of separate regions of interest of a subject along a first spatial axis, the apparatus comprising:

a gradient system to apply a magnetic field gradient;

an excitation system to apply an excitation pulse to the subject and to receive signals from the subject; and a computing system to receive the signals from the excitation system, the computing system to execute program code to:

control the gradient system and the excitation system to generate a plurality of MR pulse sequences, each MR pulse sequence being for imaging a respective one of the separate regions of interest of the subject, wherein to generate each MR pulse sequence of the plurality of MR pulse sequences, the computing system is configured to execute program code to:

(a) control the gradient system and the excitation system to generate a spatially selective preparation pulse for exciting the region of interest of the subject, the spatially selective preparation pulse comprising an excitation pulse and a magnetic field gradient along the first spatial axis, the magnetic field gradient being generated at the same time as the excitation pulse;

(b) control the gradient system and excitation system to generate a plurality of imaging sequences following the application of the spatially selective preparation pulse, the plurality of imaging sequences being for imaging the region of interest of the subject; and (c) control the excitation system to acquire MR imaging data during the generation of the plurality of imaging sequences; and wherein the computing system is configured to execute code to generate the T1 map for each region of interest from the MR imaging data acquired during the associated MR pulse sequence, wherein the plurality of MR pulse sequences are generated during a period not exceeding 30 seconds.

The MR apparatus may be operable to perform the method described above in relation to the first aspect.

The invention also encompasses a non-transitory, computer-readable medium having instructions recorded thereon which, when executed by a processing device, cause the processing device to perform the method of the first aspect.

DESCRIPTION OF THE PREFERRED EMBODIMENTS

Figure 1:
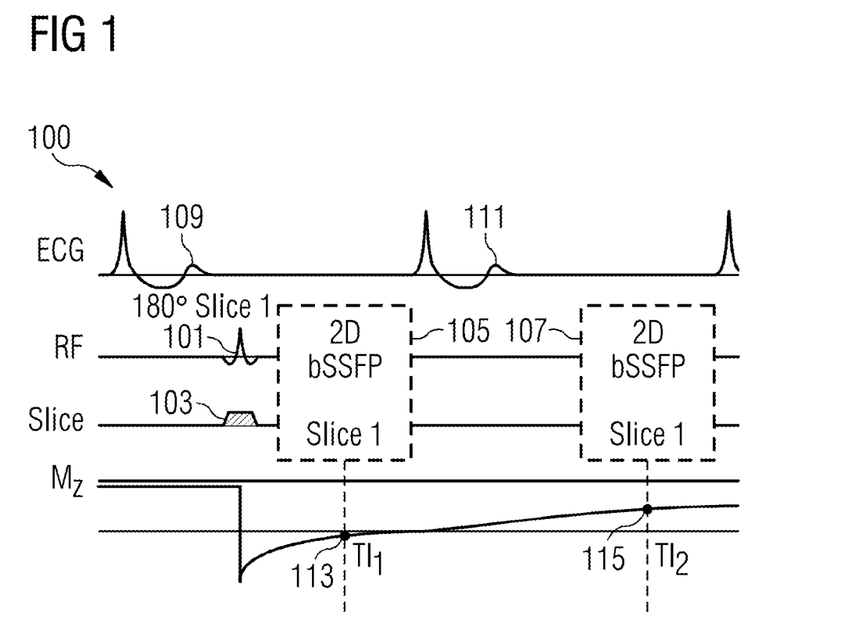
FIG. 1 shows a sequence diagram for use in generating a T1 map using a spatially selective preparation pulse according to aspects of the present invention.

Referring to FIG. 1, there is shown a MRI pulse sequence 100 for generating a T1 map in accordance with aspects of the present invention. The sequence 100 is used for myocardial T1 mapping and is ECG gated/triggered. It will be appreciated that ECG gating is not required in all embodiments of the invention.

The sequence starts by generating a spatially selective preparation pulse 101, 103 for exciting a region of interest of the subject. The generation of the spatially selective preparation pulse 101, 103 is triggered by the ECG pulse 109. The spatially selective preparation pulse comprises an excitation pulse 101 which is an inversion pulse 101 in this example implementation and a magnetic field gradient 103 which is generated along a first spatial axis. In this example implementation, the magnetic field gradient 103 is generated along the slice select axis, and is thus a slice selective magnetic field gradient 103.

Following the generation of the spatially selective preparation pulse 101, 103, a plurality of imaging sequences 105, 107 are generated. The plurality of imaging sequences 105, 107 are for imaging the region of interest of the subject. The plurality of imaging sequences 105, 107 comprise a first imaging sequence 105 generated during the same cardiac cycle as the generation of the spatially selective preparation pulse 101, 103. It will be appreciated that the first imaging sequence 105 is not required to be generated during the same cardiac cycle and could be generated during a different, following, cardiac cycle. The plurality of imaging sequences 105, 107 further comprises a second imaging sequence 107 generated during a subsequent cardiac cycle. In particular, in this example implementation, the second imaging sequence 107 is triggered by the immediately following ECG pulse 111, and is thus generated during the immediately following cardiac cycle. It will be appreciated that the second imaging sequence 107 is not required to be generated during the immediately following cardiac cycle and could, for example, be generated after one or more cardiac cycles following the first imaging sequence 105. There may be one or more rest heartbeats between imaging sequences 105, 107. This may be, for example, because an imaging sequence relating to a particular time after the generation of the spatially selective preparation pulse 101, 103 is desired.

MR imaging data is acquired during the generation of the plurality of imaging sequences 105, 107. The acquisition results in first MR imaging data 113 related to a first time period after the generation of the spatially selective preparation pulse 101, 103, and second MR imaging data 115 relating to a second, longer, time period after the generation of the spatially selective preparation pulse 101,103. The MR imaging data 113, 115 may be in the form of 2D images.

The MR imaging data 113, 115 is used to generate a T1 map. In an example implementation, the MR imaging data 113, 115 are sorted in order of increasing time after the generation of the spatially selective preparation pulse 101, 103. For T1 mapping, the signal intensity in each pixel of the MR imaging data 113, 115 is fit onto a T1 recovery curve during a T1 fitting process. The T1 fitting process may use a 2 parameter or a 3 parameter model as described above, or other forms of T1 fitting as apparent to the skilled person.

In the example implementation of FIG. 1 the plurality of imaging sequences 105, 107 are generated during the diastole period of the cardiac cycle. The diastole period is the phase of the heartbeat when the heart muscle relaxes to allow the chambers of the heart to fill with blood. It will be appreciated that the imaging sequences 105, 107 may be generated during different periods of the cardiac cycle, e.g. due to a particular requirement for the T1 map or due to the nature of the MR sequence. The diastole period may be preferred so as to reduce motion artifacts due to cardiac motion.

In the example implementation of FIG. 1, the excitation pulse 101 is an inversion pulse 101.

In the example implementation of FIG. 1, the spatially selective preparation pulse 101, 103 is generated to excite the region of interest of the subject and adjacent regions of the subject. That is, the spatially selective preparation pulse 101, 103 may be arranged to excite, in total, a region of a subject's tissue that has a thickness $T_{Total}$ which is N times the thickness ($T_{ROI}$) of that tissue imaged by an excitation pulse of the plurality imaging sequences 105, 107. In this way, the total thickness ($T_{Total}$) of the region excited by the spatially selective preparation pulse 101, 103 is N times the thickness of the region of the interest ($T_{ROI}$) imaged by the plurality of imaging sequences 105, 107. Exciting a thicker region with the spatially selective preparation pulse 101, 103 helps provide robustness against motion. N may be 4 in one example implementation, but it will be appreciated that the present invention is not limited to any particular value of N. Instead, N may be 1 or may be a real number greater than 1.

In the example implementation of FIG. 1, two imaging sequences 105, 107 used to acquire two sets of MR imaging data 115, 117 (e.g. two MR images) are shown. It will be appreciated that the present invention is not limited to generating only two imaging sequences 105, 107. Instead, any number of imaging sequences may be generated following the spatially selective preparation pulse 101, 103. It will be appreciated that the more imaging sequences 105, 107 used, the more MR imaging data acquired for generating the T1 map. It will be appreciated that more MR imaging data generally means a more precise T1 mapping, but will result in an increased image acquisition time. It will be appreciated that the skilled person may select the number of imaging sequences based on factors such as the desired quality of the T1 map, the health of the subject and the expected breath hold duration for the patient, and the desired number of T1 maps to be generated (e.g. for separate regions) during a breath hold. In some example implementations, between 2 and 14 imaging sequences, and preferably between 2 and 10 or 2 and 5 imaging sequences are used.

In the example implementation of FIG. 1, the imaging sequences 105, 107 are 2D single-shot balanced steady-state free precession, bSSFP, type sequences and are used to acquire 2D MRI images. It will be appreciated that the present invention is not limited to 2D bSSFP type sequences, and other imaging sequences are within the scope of the present invention.

The MR sequence 100 may further include a motion correction component (not shown) to compensate for misalignment among the MR imaging data prior to the T1 fitting operation to generate the T1 map. The motion correction component may include an image registration algorithm or a respiratory navigator signal.

The present invention is not limited to sequences using inversion pulses 101 and instead the excitation pulse 101 may be saturation pulse. In particular, for each MR sequence, a plurality of spatially selective preparation pulses may be generated for exciting the region of interest of the subject. Each of the plurality of spatially selective preparation pulses may precede one of the imaging sequences. In other words, the generation of each spatially selective preparation pulse is followed by the generation of an imaging sequence. Each of the spatially selective preparation pulses may be generated during a different point in the cardiac cycle such that the MR imaging data for each of the imaging sequences is obtained at the same point in the cardiac cycle, but with different times after the generation of the spatially selective preparation pulse.

The MRI sequence 100 of the example of FIG. 1 is for generating a T1 map for a single region of interest, a slice in this example, of the subject. Methods according to example implementations of the present invention may be used to generate T1 maps for a plurality of separate regions of interest, e.g. different slices, within quick succession such that all of the image data may be acquired during a single breath hold of the subject.

Figure 2:
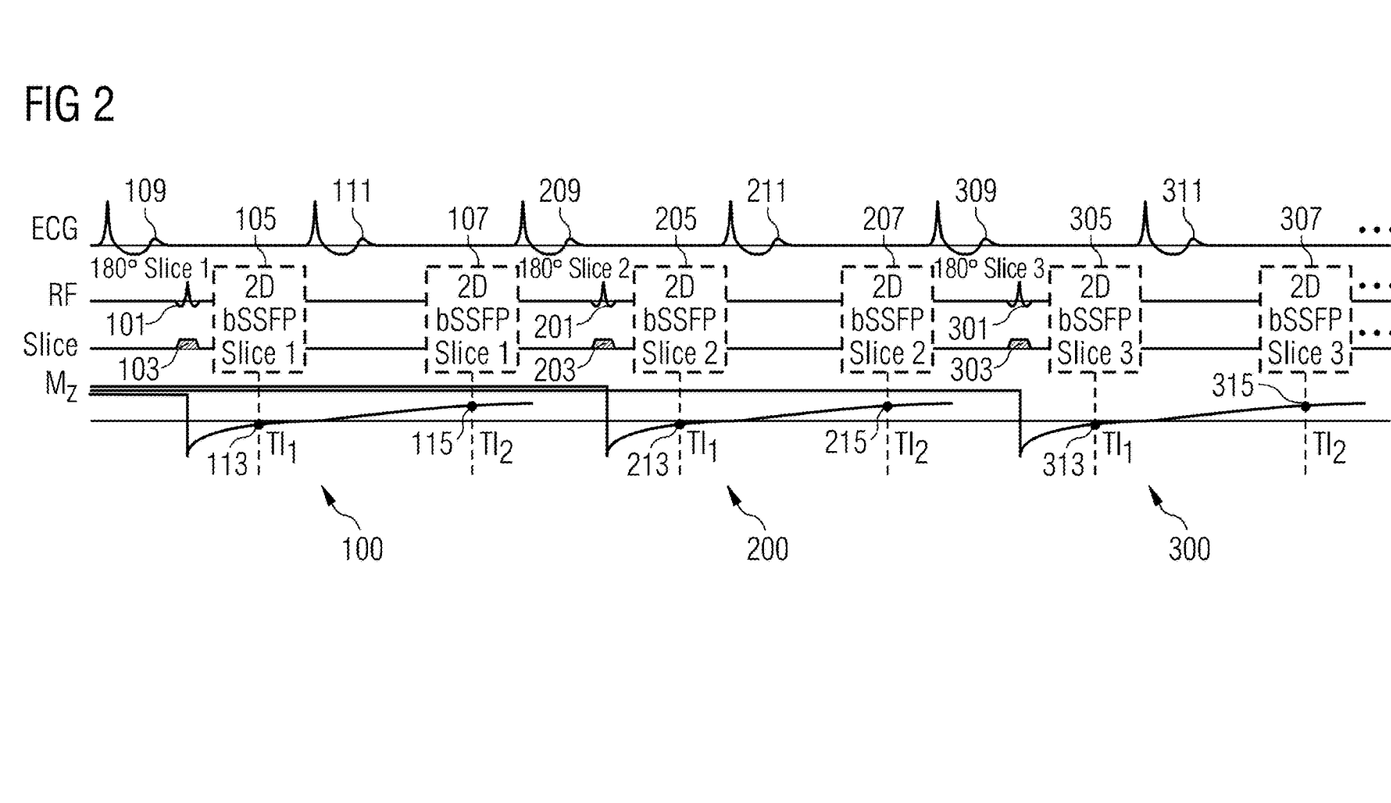
FIG. 2 shows a sequence diagram for use in generating T1 maps for three slices of a subject using spatially selective preparation pulses according to aspects of the present invention.

Referring to FIG. 2, there is shown a plurality of MR pulse sequences 100, 200, 300 for generating three T1 maps for three separate regions of interest, three different slices in this example, of the subject. The plurality of MR pulse sequences 100, 200, 300 comprises three MR sequences 100, 200, 300 each for use in generating a T1 map for one region of interest in the subject.

The first MR sequence 100 is, in this example implementation, the same as the MR sequence 100 of FIG. 1.

The second MR sequence 200 follows the same pattern as the MR sequence 100 of FIG. 1 and comprises a spatially selective preparation pulse 201, 203 triggered by a first ECG pulse 209, a first imaging sequence 205 generated during the same cardiac cycle as the spatially selective preparation pulse 201, 203, and a second imaging sequence 207 generated in the following cardiac cycle and triggered by the second ECG pulse 211. MR imaging data 213, 215 is acquired during the first and second imaging sequences 205, 207. The MR imaging data 213, 215 is used to generate a T1 map for the region of interest.

The second MR sequence 200 is however for exciting and obtaining imaging data for a separate region of interest (e.g. a different slice) to the region of interest excited and imaged by the first MR sequence 100. To this end, a different carrier frequency of the excitation pulse 201 is used compared to the carrier frequency of the excitation pulse 101 of the first MR sequence 100 such that the separate region of interest is excited. The carrier frequencies of the excitation pulses of the first and second imaging sequences 205, 207 are modified in the same way such that the excited region of interest is imaged by the imaging sequences 105, 107.

The third MR sequence 300 follows the same pattern as the MR sequence 100 of FIG. 1 and comprises a spatially selective preparation pulse 301, 303 triggered by a first ECG pulse 309, a first imaging sequence 305 generated during the same cardiac cycle as the spatially selective preparation pulse 301, 303, and a second imaging sequence 307 generated in the following cardiac cycle and triggered by the second ECG pulse 311. MR imaging data 313, 315 is acquired during the first and second imaging sequences 305, 307. The MR imaging data 313, 315 is used to generate a T1 map for the region of interest.

The third MR sequence 300 is however for exciting and obtaining imaging data for a separate region of interest (e.g. a different slice) to the region of interest excited and imaged by the first MR sequence 100 and the second MR sequence 200. To this end, a different carrier frequency of the excitation pulse 301 is used to the carrier frequency of the excitation pulse 101 of the first MR sequence 100 and the second MR sequence 200 such that the separate region of interest is excited. The carrier frequencies of the first and second imaging sequences 305, 307 are modified in the same way.

The plurality of MR pulse sequences are generated during a period not exceeding 30 seconds.

In the above example implementation, the MR sequences 100, 200, 300 are performed during a period not exceeding 30 seconds. This means that the MR imaging data 113, 115, 213, 215, 313, 315 for the regions of interest can be acquired in a period not exceeding 30 seconds, and as such may be performed during a single breath-hold for the subject. It will be appreciated that the MR sequences 100, 200, 300 may be performed during a period that is longer or shorter than 30 seconds. It will be appreciated that the skilled person may select the duration of the MR sequences 100, 200, 300 based on factors such as the desired quality of the T1 map, the health of the subject and the expected breath hold duration for the patient, and the desired number of T1 maps to be generated (e.g. for separate regions) during a breath hold.

As a result of the MR sequence 100, 200, 300, three T1 maps are generated for three separate regions of interest of the subject. Moreover, in this example, the second MR sequence 200 is generated immediately following the first MR sequence 100. That is, the second MR sequence 200 is triggered by the ECG pulse 209 which is for the cardiac cycle immediately following the end of the first MR sequence 100. Moreover, in this example, the third MR sequence 300 is generated immediately following the second MR sequence 200. That is, the third MR sequence 300 is triggered by the ECG pulse 309 which is for the cardiac cycle immediately following the end of the second MR sequence 200.

Significantly, this means that long rest periods are not required between the different MR pulse sequences 100, 200, 300. This is because the spatially selective preparation pulses used mean that only a limited region of the subject is excited by the preparation pulse. Neighboring regions (i.e. regions of adjacent slices that are desired to be imaged to generate a T1 map) are not excited or are only excited to a limited extent (e.g. incidentally). This means that present method does not need to wait for magnetization equilibrium before imaging the next region of interest because the next region of interest to be imaged is already at magnetization equilibrium. This means that the next T1 map can be generated in the same breath hold of the subject. This means that the present invention enables multi-region (e.g. multi-slice) T1 maps to be generated with minimal subject mention as the imaging data for all the regions is obtained in a single-breath hold.

In some examples, one or several rest heartbeats may be allowed to take place between the MR pulse sequences 100, 200, 300 to help reduce slice contamination. This still enables the benefit of fast generation of MR imaging data for use in the generation of multiple T1 maps of separate regions of interest of the subject.

The total thickness of the region excited by the spatially selective preparation pulse ($T_{Total}$) may have a thickness exceeding the thickness of the region of interest ($T_{ROI}$). Thicker regions may be used if the MR pulses sequences are generated in an interleaved fashion or if one or more rest heartbeats are used.

The gap between regions of interest (e.g. slices) may be thicker than the thickness $T_{Total}$ of the region excited by the spatially selective preparation pulse, but is not always required to be so.

In another example, the gap between regions of interest may be determined based on the relationship: region of interest thickness+2×gap thickness >$T_{Total}$. In this example, the gap between regions of interest may thus be less than $T_{Total}$, but may be more than $T_{Total}$ if desired. This relationship may be used, in particular, when the MR pulse sequences are generated in a non-interleaved fashion.

In another example, the gap between regions of interest may be determined based on the relationship: 3×region of interest thickness+4×gap thickness >$T_{Total}$. This relationship may be used, in particular, when the MR pulse sequences are generated in an interleaved fashion.

By determining the gap between regions of interest according to the above relationships, this helps enable there to be no or only limited (e.g. incidental) excitation of to-be imaged regions of interest that are adjacent to the region of interest excited by the spatially selective preparation pulse.

In one example, the gap between regions of interest (e.g. slices) may be between 0.5 and 1.5 times the thickness $T_{Total}$. In one example, the gap between regions of interest (e.g. slices) may be between 0 to 5 times the thickness of the region of interest $T_{ROI}$, and is preferably 2 times the thickness of the region of interest $T_{ROI}$.

The regions of interest may be obtained in an interleaved manner. For example, separate regions of interest, e.g. separated by 2 times the thickness of the region of interest may be obtained first, and then regions of interest between these separate regions of interest may be obtained. In this way, the gaps between the separate regions of interest are also imaged. This can be thought of as obtaining even-numbered regions of interest first and then obtaining odd-numbered regions of interest.

Figure 3A:
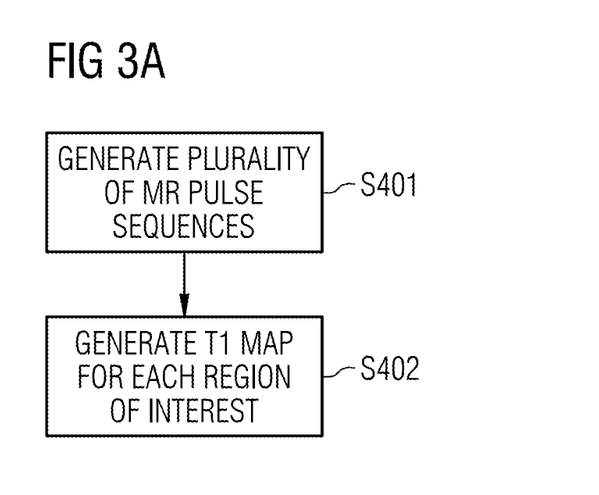
FIGS. 3a and 3b show process diagrams for an example method according to the first aspect of the present invention.

Referring to FIG. 3a, there is shown an example method according to the first aspect of the disclosure.

Step 401 involves generating a plurality of MR pulse sequences, each MR pulse sequence being for imaging a respective one of the separate regions of interest of the subject.

Figure 3B:
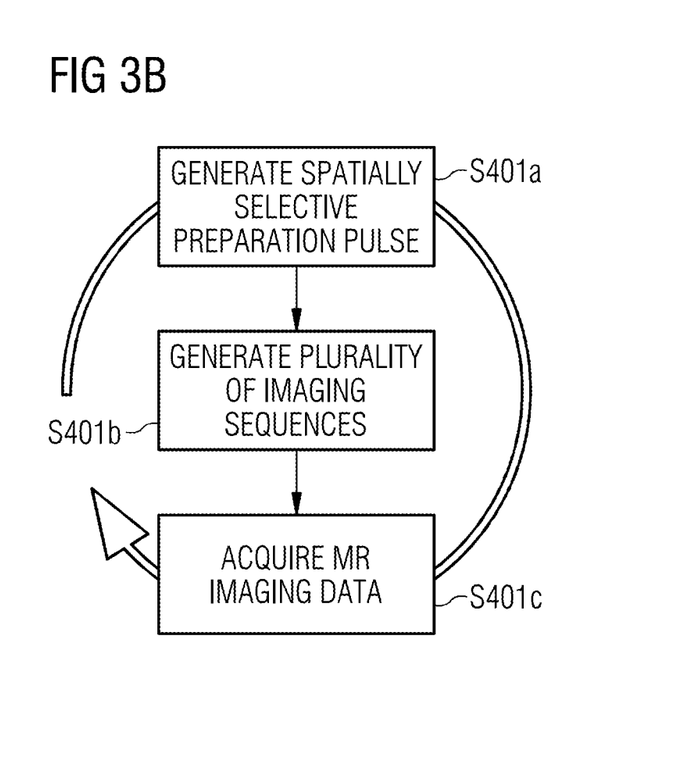

Step 402 involves generating, for each region of interest, the T1 map for the region of interest from MR imaging data acquired during the associated MR pulse sequence, Referring to FIG. 3b, there is shown further detail of step 401 of FIG. 3a. In particular, generating each MR pulse sequence comprises performing steps 401a-401c. The arrow forming a loop in FIG. 3b shows that steps 401a-401c are performed for each MR pulse sequence.

Step 401a involves generating a spatially selective preparation pulse for exciting the region of interest of the subject, the generating comprising generating an excitation pulse at the same time as generating a magnetic field gradient along a first spatial axis.

Step 401b involves generating a plurality of imaging sequences following the application of the spatially selective preparation pulse, the plurality of imaging sequences being for imaging the region of interest of the subject;

Step 401c acquiring MR imaging data during the generation of the plurality of imaging sequences.

Step 401 of generating the plurality of MR pulse sequences is performed during a period not exceeding 30 seconds.

Figure 4:
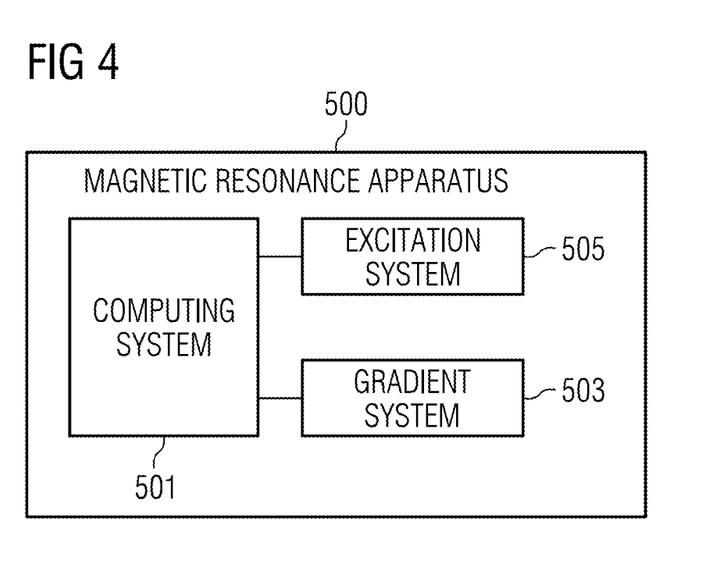
FIG. 4 shows an example MR apparatus according to the second aspect of the present invention.

Referring to FIG. 4, there is shown an example MR apparatus 500 according the second aspect of the disclosure. The MR apparatus 500 comprises a computing system 501, a gradient system 503, and an excitation system 505.

The gradient system 503 is configured to apply a magnetic field gradient. The gradient system 503 may be configured to apply magnetic field gradients along three spatial axes.

The excitation system 505 may comprise a transmitter (not shown) and a receiver (not shown). The excitation system 505 can be an RF system with one or more RF coils (not shown). The excitation system 505 is configured to apply an excitation pulse to the subject and to receive signals from the subject.

The MR apparatus 500 includes a magnet (not shown) for establishing a stationary magnetic field. The magnet can include a permanent magnet, a superconducting magnet or other type of magnet.

The computing system 501 is in communication with the excitation system 505, and the gradient system 503 for controlling these components. The computing system 501 is configured to receive the signals from the excitation system 505.

The computing system 501 is further configured to execute program code to control the gradient system 503 and the excitation system 505 to generate a plurality of MR pulse sequences, each MR pulse sequence being for imaging a respective one of the separate regions of interest of the subject.

To generate each of the plurality of MR pulse sequences, the computing system 501 is configured to execute program code to:

(a) control the gradient system 503 and the excitation system 505 to generate a spatially selective preparation pulse for exciting the region of interest of the subject, the spatially selective preparation pulse comprising an excitation pulse and a magnetic field gradient along a first spatial axis, the magnetic field gradient being generated at the same time as the excitation pulse;

(b) control the gradient system 503 and excitation system 505 to generate a plurality of imaging sequences following the application of the spatially selective preparation pulse, the plurality of imaging sequences being for imaging the region of interest of the subject; and (c) control the excitation system 503 to acquire MR imaging data during the generation of the plurality of imaging sequences.

The computing system 501 is configured to execute code to generate, for each region of interest, the T1 map for the region of interest from the MR imaging data acquired during the associated MR pulse sequence. The plurality of MR pulse sequences are generated during a period not exceeding 30 seconds.

The computing system 501 is configured to execute program code for controlling the MR apparatus 500 to perform the method of the first aspect. The computing system 501 could be an integrated component of the MR apparatus 500. The computing system 501 could be a unit of a desktop computer, a workstation, a server, or a laptop computer.

According to aspects of the invention, there is also provided a computer-readable medium having instructions recorded thereon which, when executed by a processing unit, cause the processing unit to perform the method of the first or second aspect.

In other words, there is provided a method of performing magnetic resonance, MR, imaging for generating a plurality of T1 maps of separate regions of interest of a subject along a first spatial axis. The method comprising generating a plurality of MR pulse sequences 100, 200, 300 (FIG. 2). Each MR pulse sequence 100, 200, 300 being for imaging a respective one of the separate regions of interest of the subject. Generating each of the plurality of MR pulse sequences 100, 200, 300 comprises: generating a spatially selective preparation pulse 101, 103 for exciting the region of interest of the subject; generating a plurality of imaging sequences 105, 107 following the application of the spatially selective preparation pulse 101, 103; and acquiring MR imaging data 113, 115 during the generation of the plurality of imaging sequences 105, 107. The plurality of MR pulse sequences are generated during a period not exceeding 30 seconds At least some of the example embodiments described herein may be constructed, partially or wholly, using dedicated special-purpose hardware. Terms such as 'component', 'module' or 'unit' used herein may include, but are not limited to, a hardware device, such as circuitry in the form of discrete or integrated components, a Field Programmable Gate Array (FPGA) or Application Specific Integrated Circuit (ASIC), which performs certain tasks or provides the associated functionality. In some embodiments, the described elements may be configured to reside on a tangible, persistent, addressable storage medium and may be configured to execute on one or more processors. These functional elements may in some embodiments include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. Although the example embodiments have been described with reference to the components, modules and units discussed herein, such functional elements may be combined into fewer elements or separated into additional elements.

The described and illustrated embodiments are to be considered as illustrative and not restrictive in character, it being understood that only the preferred embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method of performing magnetic resonance (MR) imaging for generating a plurality of T1 maps of separate regions of interest of a subject along a first spatial axis, the method comprising:

generating a plurality of MR pulse sequences, each MR pulse sequence being for imaging a respective one of the separate regions of interest of the subject, wherein generating each MR pulse sequence of the plurality of MR pulse sequences comprises:

(a) generating a spatially selective preparation pulse for exciting the separate region of interest of the subject, the generating comprising generating an excitation pulse simultaneously with a magnetic field gradient along the first spatial axis;

(b) generating a plurality of imaging sequences following an application of the spatially selective preparation pulse, the plurality of imaging sequences being for imaging the separate region of interest of the subject; and (c) acquiring MR imaging data during the generation of the plurality of imaging sequences; and generating, for each separate region of interest, a T1 map for the separate region of interest from the MR imaging data acquired during an associated MR pulse sequence, wherein:

the plurality of MR pulse sequences are generated during a period not exceeding 30 seconds;

for at least one of the plurality of MR pulse sequences, the spatially selective preparation pulse is generated to excite the separate region of interest of the subject and adjacent separate regions of the subject; and a total thickness of the separate region of interest excited by the spatially selective preparation pulse has a total thickness exceeding a thickness of the separate region of interest imaged by the plurality of imaging sequences.

2. A method as claimed in claim 1, wherein the plurality of MR pulse sequences are generated during a period not exceeding 20 seconds.

3. A method as claimed in claim 2, wherein the plurality of MR pulse sequences are generated during a period of between 2 and 14 seconds.

4. A method as claimed in claim 1, wherein the plurality of MR pulse sequences comprise between 2 and 12 MR pulse sequences.

5. A method as claimed in in claim 1, wherein, for at least one of the plurality of MR pulse sequences, the magnetic field gradient along the first spatial axis is a slice-selective magnetic field gradient.

6. A method as claimed in in claim 1, wherein, for at least one of the plurality of MR pulse sequences, the excitation pulse is an inversion pulse, or a saturation pulse, or a combination of saturation and inversion pulses.

7. A method as claimed in in claim 1, wherein, for the at least one of the plurality of MR pulse sequences, the total thickness of the separate region of interest excited by the spatially selective preparation pulse has a thickness $T_{Total}$ which is N times a thickness of a separate region of the interest $T_{ROI}$ imaged by the plurality of imaging sequences, where N is a number between greater than 1 and less than or equal to 50.

8. A method as claimed in in claim 1, wherein, for at least one of the plurality of MR pulse sequences, each imaging sequence is generated during a different cardiac cycle of the subject.

9. A method as claimed in claim 8, wherein, for at least one of the plurality of MR pulse sequences, a first of the plurality of imaging sequences is generated during a same cardiac cycle as the generation of the spatially selective preparation pulse.

10. A method as claimed in claim 8, wherein, for at least one of the plurality of MR pulse sequences, a first of the plurality of imaging sequences is generated during a different cardiac cycle to the generation of the spatially selective preparation pulse.

11. A method as claimed in claim 9, wherein, for at least one of the plurality of MR pulse sequences, the spatially selective preparation pulse and/or the plurality of imaging sequences are each triggered by a cardiac event as measured by a cardiac monitoring apparatus.

12. A method as claimed in in claim 1, wherein at least one of the plurality of T1 maps is a cardiac T1 map.

13. A method as claimed in in claim 1, wherein, for at least one of the plurality of MR pulse sequences, the plurality of imaging sequences comprise balanced gradient pulse trains.

14. A method as claimed in claim 13, wherein, for at least one of the plurality of MR pulse sequences, the plurality of imaging sequences are balanced steady-state free precession, bSSFP, type sequences.

15. A magnetic resonance (MR) apparatus for generating a plurality of T1 maps of separate regions of interest of a subject along a first spatial axis, the apparatus comprising:
  a gradient system to apply a magnetic field gradient;
  an excitation system to apply an excitation pulse to the subject and to receive signals from the subject; and
  a computing system to receive the signals from the excitation system, the computing system to execute program code to:
control the gradient system and the excitation system to generate a plurality of MR pulse sequences, each MR pulse sequence being for imaging a respective one of the separate regions of interest of the subject,
wherein to generate each MR pulse sequence of the plurality of MR pulse sequences, the computing system is configured to execute program code to:
  (a) control the gradient system and the excitation system to generate a spatially selective preparation pulse for exciting the separate region of interest of the subject, the spatially selective preparation pulse comprising an excitation pulse and a magnetic field gradient along the first spatial axis, the magnetic field gradient being generated simultaneously with the excitation pulse;
  (b) control the gradient system and excitation system to generate a plurality of imaging sequences following an application of the spatially selective preparation pulse, the plurality of imaging sequences being for imaging the separate region of interest of the subject; and
  (c) control the excitation system to acquire MR imaging data during the generation of the plurality of imaging sequences; and
wherein the computing system is configured to execute code to generate, for each separate region of interest, a T1 map for the separate region of interest from the MR imaging data acquired during an associated MR pulse sequence, wherein:
  the plurality of MR pulse sequences are generated during a period not exceeding 30 seconds;
  for at least one of the plurality of MR pulse sequences, the spatially selective preparation pulse is generated to excite the separate region of interest of the subject and adjacent separate regions of the subject; and
  a total thickness of the separate region of interest excited by the spatially selective preparation pulse has a thickness exceeding a thickness of the separate region of interest.

16. A non-transitory, computer-readable data storage medium encoded with programming instructions, said storage medium being loaded into a computer of a magnetic resonance (MR) apparatus for generating a plurality of T1 maps of separate regions of interest of a subject along a first spatial axis, and said programming instructions causing said computer to:
  generate a plurality of MR pulse sequences, each MR pulse sequence being for imaging a respective one of the separate regions of interest of the subject, wherein generating each MR pulse sequence of the plurality of MR pulse sequences comprises:
    (a) generate a spatially selective preparation pulse for exciting the separate region of interest of the subject, the generating comprising generating an excitation pulse simultaneously with a magnetic field gradient along the first spatial axis;
    (b) generate a plurality of imaging sequences following an application of the spatially selective preparation pulse, the plurality of imaging sequences being for imaging the separate region of interest of the subject; and
    (c) acquire MR imaging data during the generation of the plurality of imaging sequences; and
  generating, for each separate region of interest, a T1 map for the region of interest from the MR imaging data acquired during an associated MR pulse sequence, wherein:

the plurality of MR pulse sequences are generated during a period not exceeding 30 seconds;

for at least one of the plurality of MR pulse sequences, the spatially selective preparation pulse is generated to excite the separate region of interest of the subject and adjacent regions of the subject; and a total thickness of the separate region of interest excited by the spatially selective preparation pulse has a thickness exceeding a thickness of the separate region of interest imaged by the plurality of imaging sequences.

17. A method of performing magnetic resonance (MR) imaging for generating a plurality of T1 maps of separate regions of interest of a subject along a first spatial axis, the method comprising:

generating a plurality of MR pulse sequences, each MR pulse sequence being for imaging a respective one of the separate regions of interest of the subject, wherein generating each MR pulse sequence of the plurality of MR pulse sequences comprises:

(a) generating a spatially selective preparation pulse for exciting the separate region of interest of the subject, the generating comprising generating an excitation pulse simultaneously with a magnetic field gradient along the first spatial axis;

(b) generating a plurality of imaging sequences following an application of the spatially selective preparation pulse, the plurality of imaging sequences being for imaging the separate region of interest of the subject; and (c) acquiring MR imaging data during the generation of the plurality of imaging sequences; and generating, for each separate region of interest, a T1 map for the separate region of interest from the MR imaging data acquired during an associated MR pulse sequence, wherein:

the plurality of MR pulse sequences are generated during a period not exceeding 30 seconds; and for at least one of the plurality of MR pulse sequences, a total thickness of the separate region of interest excited by the spatially selective preparation pulse has a thickness $T_{Total}$ which is N times a thickness of a separate region of interest $T_{ROI}$ imaged by the plurality of imaging sequences, where N is a number between 1 and 50.

18. A non-transitory, computer-readable data storage medium encoded with programming instructions, said storage medium being loaded into a computer of a MR apparatus, and said programming instructions causing said computer to perform the method of claim 17.

19. A MR apparatus for generating the plurality of T1 maps of separate regions of interest of a subject along a first spatial axis, the apparatus comprising:

a gradient system to apply the magnetic field gradient;

an excitation system to apply an excitation pulse to the subject and to receive signals from the subject; and a computing system to receive the signals from the excitation system, the computing system to execute program code to control the gradient system and the excitation system to perform the method of claim 17.

* * * * *